US012777793B2

(12) United States Patent
Park

(10) Patent No.: US 12,777,793 B2
(45) Date of Patent: Oct. 27, 2026

(54) DISPLAY PANEL AND DISPLAY DEVICE INCLUDING THE SAME

(71) Applicant: LG Display Co., Ltd., Seoul (KR)

(72) Inventor: Woosung Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 300 days.

(21) Appl. No.: 18/396,389

(22) Filed: Dec. 26, 2023

(65) Prior Publication Data

US 2024/0224650 A1 Jul. 4, 2024

(30) Foreign Application Priority Data

Dec. 29, 2022 (KR) ........................ 10-2022-0189074

(51) Int. Cl.

| | |
|---|---|
| ***H10K 59/131*** | (2023.01) |
| ***G09G 3/3258*** | (2016.01) |
| ***H10K 59/122*** | (2023.01) |
| ***H10K 59/35*** | (2023.01) |

(52) U.S. Cl.

CPC ......... *H10K 59/131* (2023.02); *G09G 3/3258* (2013.01); *H10K 59/122* (2023.02); *H10K 59/35* (2023.02)

(58) Field of Classification Search

CPC .... H10K 59/131; H10K 59/122; H10K 59/35; H10K 59/351; H10K 59/805; H10K 59/875; G09G 3/3258; G09G 3/3208; G09G 3/32; G09G 2300/0426; G09G 2300/0439; G09G 2330/06; H10W 90/00; H10W 42/60; H10H 20/857; H10H 29/142; H10H 20/831; H10H 20/855; H10D 86/60; H10D 89/60; H10D 86/441

USPC ............................................................ 257/40

See application file for complete search history.

(56) References Cited

U.S. PATENT DOCUMENTS

| | | | | |
|---|---|---|---|---|
| 8,139,331 | B2 | 3/2012 | Kim et al. | |
| 2010/0157494 | A1 | 6/2010 | Kim et al. | |
| 2015/0303179 | A1 | 10/2015 | Liu et al. | |
| 2019/0386074 | A1 | 12/2019 | Li et al. | |
| 2020/0302841 | A1* | 9/2020 | Jung | G09G 3/006 |
| 2021/0202907 | A1 | 7/2021 | Lee et al. | |

(Continued)

FOREIGN PATENT DOCUMENTS

| | | | |
|---|---|---|---|
| CN | 113206138 | A | 8/2021 |
| EP | 3188241 | A1 | 7/2017 |

(Continued)

OTHER PUBLICATIONS

Taiwan Intellectual Property Office, Office Action, Taiwanese Patent Application No. 112151043, Oct. 4, 2024, five pages.

(Continued)

*Primary Examiner* — Tong-Ho Kim

(74) *Attorney, Agent, or Firm* — Fenwick & West LLP

(57) ABSTRACT

Disclosed are a display panel and a display device including the display panel in which an unused light-emitting element disposed in a bezel area is used as an electrostatic discharge (ESD) circuit. The display panel includes at least one first pixel disposed in an active area; and at least one second pixel disposed in the bezel area, wherein the first pixel and the second pixel operate at voltages of different potentials, respectively. Therefore, the unused light-emitting element disposed in the bezel area acts as the electrostatic discharge (ESD) circuit.

14 Claims, 8 Drawing Sheets

(56) References Cited

U.S. PATENT DOCUMENTS

| | | | | |
|---|---|---|---|---|
| 2021/0217353 | A1 | 7/2021 | Zhao et al. | |
| 2022/0302203 | A1 | 9/2022 | Lee et al. | |
| 2022/0406975 | A1* | 12/2022 | Lee | G06F 1/1652 |

FOREIGN PATENT DOCUMENTS

| | | | | |
|---|---|---|---|---|
| JP | 2007165748 | A | * | 6/2007 |
| JP | 2010-153779 | A | | 7/2010 |
| JP | 2015-008036 | A | | 1/2015 |
| KR | 10-2019-0003163 | A | | 1/2019 |
| KR | 10-2019-0113535 | A | | 10/2019 |
| KR | 10-2022-0131453 | A | | 9/2022 |

OTHER PUBLICATIONS

The Japan Patent Office, Office Action, Japanese Patent Application No. 2023-204334, Nov. 26, 2024, 13 pages.
European Patent Office, Extended European Search Report, European Patent Application No. 23216674.4, Jun. 14, 2024, nine pages.

* cited by examiner

DISPLAY PANEL AND DISPLAY DEVICE INCLUDING THE SAME

CROSS-REFERENCE TO RELATED APPLICATION

This application claims priority from Korean Patent Application No. 10-2022-0189074 filed on Dec. 29, 2022 in the Korean Intellectual Property Office, and all the benefits accruing therefrom under 35 U.S.C. 119, the contents of which in its entirety are herein incorporated by reference.

BACKGROUND

Field

The present disclosure relates to a display panel and a display device including the same.

Description of Related Art

A display device with a self-light-emitting element may be implemented to be thinner than a display device with a built-in light source, and has the advantage of being able to implement a flexible and foldable display device.

Such a display device having the self-light-emitting element may include an organic light-emitting display device using a light-emissive layer made of an organic material, and a micro-LED display device using a micro light-emitting diode.

However, while the organic light-emitting display device does not require a separate light source, a defective pixel may easily occur due to moisture and oxygen. Thus, various technical ideas are additionally required to minimize penetration of oxygen and moisture. In response to this demand, recently, research and development on a display device using a micro light-emitting diode as a light-emitting element has been conducted.

The micro light-emitting diode is a semiconductor light-emitting element that uses property of emitting light when current flows through a semiconductor, and is widely used in a lighting apparatus, TV, and various display devices.

SUMMARY

However, the display device using the micro light-emitting diode does not have semiconductor (a-Si), oxide, and low-temperature polycrystalline silicon (LTPS) layers. Thus, a thin-film transistor cannot be realized in a display panel itself.

Therefore, an electrostatic discharge (hereinafter, referred to as ESD) circuit cannot be designed in the display device using the micro light-emitting diode. Thus, the display device using the micro light-emitting diode has the disadvantage of being vulnerable to static electricity.

Accordingly, in order to solve the above-mentioned disadvantage, the inventor of the present disclosure has invented a display panel in which a light-emitting element disposed in a bezel area but not used as a pixel acts as an element that copes with the static electricity.

Therefore, a technical purpose to be achieved by the present disclosure is to provide a display panel in which a static electricity coping electrode is disposed at each of the light-emitting elements disposed in the bezel area of the display panel such that each of the light-emitting elements at which the static electricity coping electrode is disposed acts as a static electricity coping area, and to provide a display device that includes the display panel.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

A display panel according to an embodiment of the present disclosure may be provided. The display panel includes at least first pixel disposed in a first area; and at least one second pixel disposed in a second area, wherein the first pixel and the second pixel operate at voltages of different potentials, respectively.

A display device according to an embodiment of the present disclosure may be provided. The display device includes a display panel including: at least first pixel disposed in a first area; and at least one second pixel disposed in a second area; and a driver disposed on a rear surface of the display panel and in the first area, wherein the driver controls a light-emission operation of the at least one first pixel, wherein the first pixel includes at least one sub-pixel, wherein each of the at least one sub-pixel thereof has a first electrode at one side and a second electrode at a opposite side thereto, wherein the second pixel includes at least one sub-pixel, wherein each of the at least one sub-pixel thereof has a first electrode at one side and a second electrode at a opposite side thereto, wherein the second electrode acts as a power supply electrode, wherein the first electrode of the sub-pixel of the second pixel is connected to a ground, and the second electrode thereof as the power supply electrode is connected to a power supply line, wherein the first pixel and the second pixel operate at voltages of different potentials, respectively.

According to the embodiments of the present disclosure, in the display device free of a backplane made of semiconductor (a-Si), oxide, and low-temperature polycrystalline silicon (LTPS), unused light-emitting elements disposed in the bezel area may be utilized as the electrostatic discharge (ESD) circuit.

Further, according to the embodiments of the present disclosure, the ESD circuit may be provided even in the display device without the backplane, thereby protecting the display panel from the static electricity.

Further, according to the embodiments of the present disclosure, a separate electrostatic discharge (ESD) circuit is not installed, but unused light-emitting elements disposed in the bezel area may be utilized as the electrostatic discharge (ESD) circuit. Thus, a manufacturing process may be reduced and a manufacturing cost may be saved accordingly.

Further, according to the embodiments of the present disclosure, the panel damage caused by the static electricity may be prevented, thereby improving the quality and reliability of the display device.

Moreover, according to an embodiment of the present disclosure, unused light-emitting elements disposed in the bezel area may be utilized as the electrostatic discharge (ESD) circuit to secure reliability of the display device and to implement a stable narrow bezel.

In another embodiment, a display panel comprises a plurality of bezel area pixels disposed in a bezel area of the display panel surrounding at least a part of the active area, one or more of the bezel area pixels each including one or more bezel area sub-pixels configured not to emit light, a plurality of bezel area pixels disposed in a bezel area of the display panel surrounding at least a part of the active area, one or more of the bezel area pixels each including one or more bezel area sub-pixels configured not to emit light, wherein the bezel area sub-pixels comprise: a first bezel area sub-pixel having a first electrode and a second electrode, the first electrode electrically connected to a common node and the second electrode electrically connected to a first power supply line: and a second bezel area sub-pixel having a third electrode and a fourth electrode, the third electrode electrically connected to the common node and the fourth electrode electrically connected to a second power supply line different from the first power supply line.

Effects of the present disclosure are not limited to the effects as mentioned above, and other effects not mentioned will be clearly understood by those skilled in the art from the descriptions below.

In addition to the effects as described above, specific effects of the present disclosure will be described together while describing specific details for carrying out the present disclosure.

DETAILED DESCRIPTIONS

Figure 1:
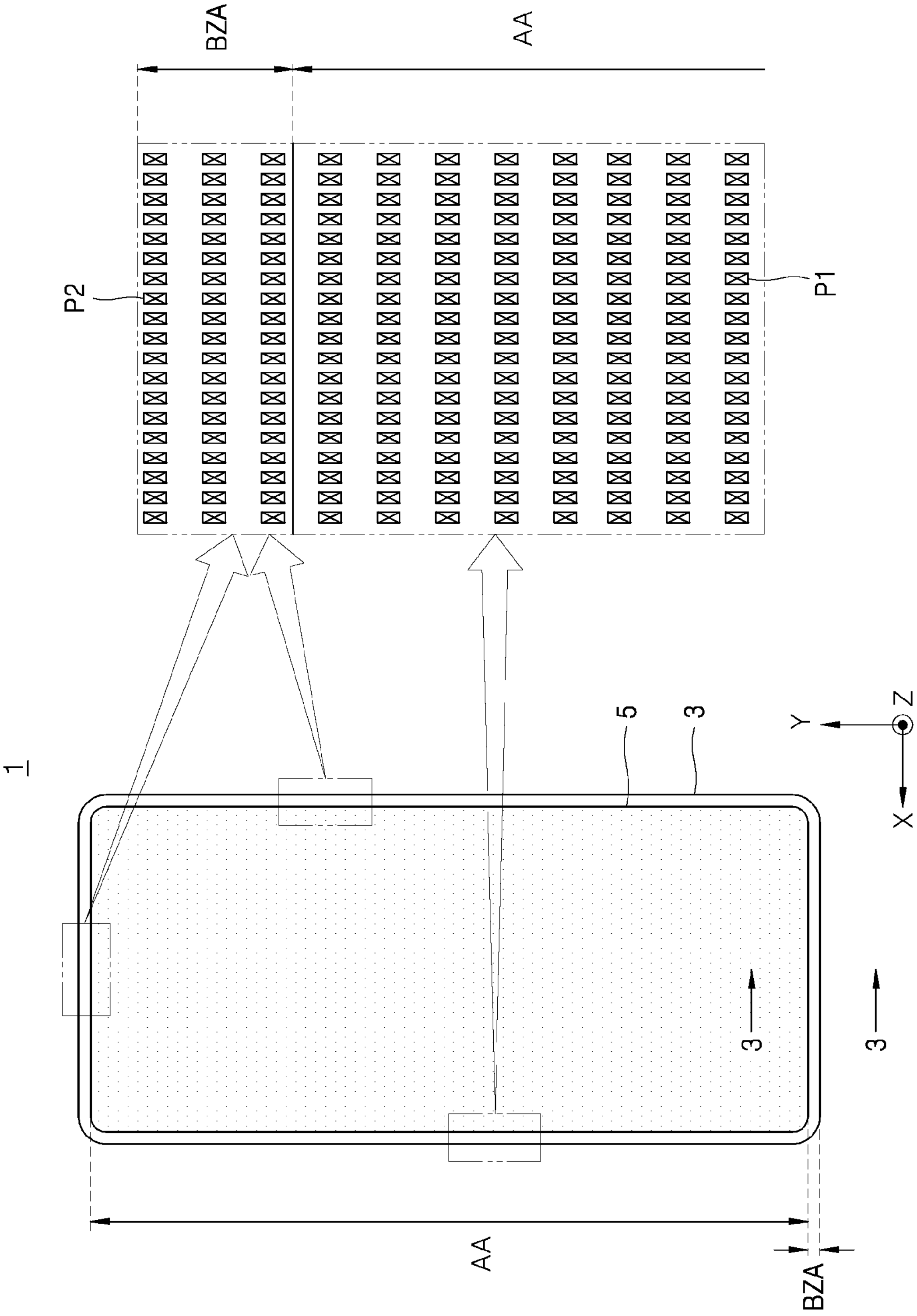
FIG. 1 is a plan view showing a front surface, a display area, and a bezel area of a display device according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

When a certain embodiment can be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display panel according to an embodiment of the present disclosure and a display device including the same will be described.

FIG. 1 is a plan view showing a front surface, a display area, and a bezel area of a display device according to an embodiment of the present disclosure.

Referring to FIG. 1, a display device 1 according to an embodiment of the present disclosure may include a cover member 3 constituting a front surface thereof, and a display panel 5.

The cover member 3 may be referred to as a cover glass (CG). The cover member 3 may include a cover glass and a cover window.

A display module and a back frame (not shown) may be disposed on a rear surface of the cover member 3. In this regard, the display module may include, for example, a substrate, a buffer layer, a planarization layer, a diffuser window DW, and an ohmic contact layer OC.

The cover member 3 is disposed to cover a front surface of the display module and may serve to protect the display module from external impact. An edge portion of the cover member 3 may have a round shape curved in a direction toward the rear surface thereof on which the display module is disposed.

In this case, the cover member 3 may be disposed to cover at least a partial area of a side surface of the display module disposed on the rear surface thereof, so that the cover member 3 may play a role of protecting not only the front surface of the display module but also the side surface thereof from the external impact.

The display device 1 may include the display panel 5. The display panel 5 may include the display module disposed on the rear surface of the cover member. Since the cover member 3 includes a display area AA that displays a screen, the cover member 3 may be made of a transparent material such as a cover glass to display the screen therethrough. For example, the cover member 3 may be made of a transparent plastic material, a glass material, or a tempered glass material.

The back frame may be disposed on a rear surface of the display module so as to accommodate therein the display module and contact the cover member 3 so as to support the cover member 3.

The back frame may serve as a housing that constitutes an outer edge and a rear surface of the display device 1, and may be made of a polymer epoxy-based resin material.

In this case, the back frame may function as a casing constituting the outermost portion of the display device 1. However, the present disclosure is not limited thereto. For example, the back frame may function as a middle frame serving as a housing protecting the rear surface of the display module.

The display module coupled to the rear surface of the cover member 3 may be a bent area BA. The bent area BA may be located in a bezel area BZA at the rear surface of the cover member 3 facing in a −Z axis direction.

In order to reduce the bezel area BZA, a radius of curvature of the bent area BA needs to be reduced. The radius of curvature of the bent area BA is proportional to a total thickness of the display device 1 including the display module. As the total thickness increases, the radius of curvature of the bent area BA increases. Conversely, when the total thickness decreases, the radius of curvature of the bent area BA decreases. Therefore, in order not to increase a size of the bezel area BZA, it is necessary to prevent the overall thickness of the display device 1 including the display module from increasing.

The display panel 5 may include a first area AA and a second area BZA. The first area AA may be a display area or an active area AA, and the second area BZA may be the bezel area BZA. The bezel area BZA may extend along the outermost edge of the display device 1 so as to surround the display area AA. The bezel area BZA may include the bent area BA at the rear surface of the display panel.

At least one or more first pixels P1 may be disposed in the first area AA, and at least one or more second pixels P2 may be disposed in the second area BZA. The first pixel P1 and the second pixel P2 may operate at voltages of different potentials, respectively. For example, the first pixel P1 may operate based on a specific data voltage, and the second pixel P2 may operate based on a shock pulse voltage by static electricity.

In some embodiments, each of the first pixel P1 and the second pixel P2 may include an organic light-emitting diode (OLED).

In other embodiments, each of the first pixel P1 and the second pixel P2 may be embodied as a micro-LED chip. In this case, in each of the first pixel P1 and the second pixel P2, a micro-LED chip in a flip scheme may be disposed. Further, in each of the first pixel P1 and the second pixel P2, a micro-LED chip in a lateral manner or a vertical manner may be disposed. That is, the micro-LED chips may be disposed in a flip or lateral manner. Further, a spare area may be disposed around each of the first pixel P1 and the second pixel P2.

Each of the first pixel P1 and the second pixel P2 includes at least one or more sub-pixels. Each of the first pixel P1 and the second pixel P2 may be a sub-pixel SP emitting red, blue, or green light. However, the present disclosure is not limited thereto.

Figure 2A:
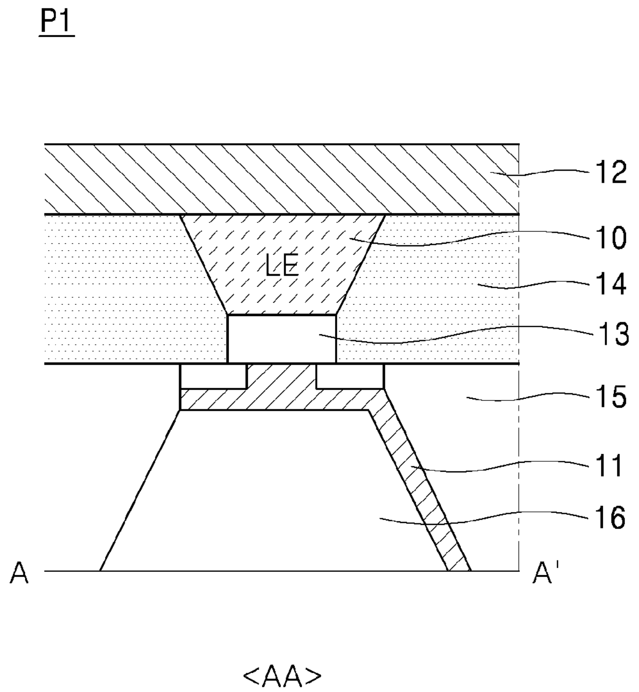
FIG. 2A is a diagram schematically showing a structure of a first pixel disposed in a display area according to an embodiment of the present disclosure.
Figure 2B:
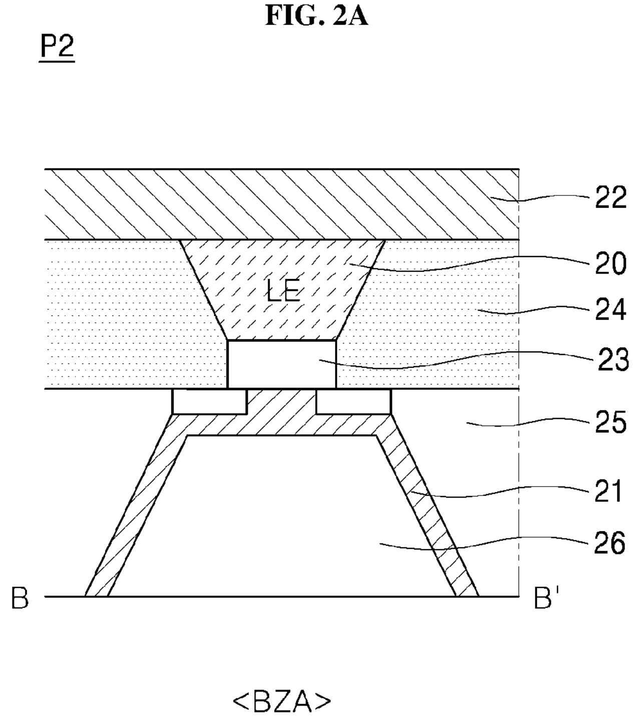
FIG. 2B is a diagram schematically showing a structure of a second pixel disposed in a bezel area according to an embodiment of the present disclosure.

Alternatively, each of the first pixel P1 and the second pixel P2 may be a sub-pixel emitting white light. FIG. 2A is a cross-sectional view of the first pixel disposed in the display area according to an embodiment of the present disclosure, and more specifically a cross-sectional view taken along A-A' of FIG. 3. FIG. 2B is a cross-sectional view of the second pixel disposed in the bezel area according to an embodiment of the present disclosure and more specifically a cross-sectional view as taken along B-B' of FIG. 5A.

Referring to FIG. 2A, the first pixel P1 according to an embodiment of the present disclosure may be disposed in the display area AA and may include a first electrode 11 disposed at one side and a second electrode 12 disposed at the other side thereto. The first electrode 11 of the first pixel P1 may be an anode electrode for light-emission, and the second electrode 12 of the first pixel P1 may be a cathode electrode for light-emission.

In the first pixel P1, the first electrode 11 may be disposed on a bank layer 16. The first electrode 11 of the first pixel P1 may be disposed to cover an upper surface of the bank layer 16 and one side wall thereof. The first electrode 11 may be the anode electrode for light-emission. Accordingly, the first electrode 11 of the first pixel P1 disposed to cover the upper surface and one side wall of the bank layer 16 may receive a light-emission power from the driving transistor.

A diffuser window layer 15 may be disposed above the first electrode 11 and the bank layer 16.

A conductive layer 13 may be disposed on the first electrode 11, and an active layer 10 may be disposed on the conductive layer 13. The active layer 10 may be referred to as a ‘light-emission layer’ or ‘light-emissive element’. Accordingly, at least one first pixel P1 may be configured to emit light of one color among red (R), green (G), blue (B), and white (W). Alternatively, the first pixels P1 may be configured to emit light of red (R), green (G), and blue (B), respectively. In this case, the first pixels P1 emitting light of red (R), green (G), and blue (B), respectively may constitute one unit pixel or one unit pixel area.

A sidewall diffuser layer 14 may be disposed on the diffuser window layer 15 so as to surround the conductive layer 13 and the active layer 10.

The second electrode 12 may be disposed on the sidewall diffuser layer 14 and the active layer 10. The second electrode 12 may be the cathode electrode for light-emission.

Referring to FIG. 2B, the second pixel P2 according to an embodiment of the present disclosure may be disposed in the bezel area BZA, and may include a first electrode 21 disposed at one side thereof, and a power supply electrode 22 disposed at the other side thereto.

In some of the second pixels P2, the first electrode 21 of the second pixel P2 may be connected to a ground, and the power supply electrode 22 thereof may be connected to a power supply line. In other ones of the second pixels P2, the first electrode 21 of the second pixel P2 may be a data line electrode, and the power supply electrode as the second electrode of the second pixel P2 may be a high-potential voltage (VDD) electrode or a low-potential voltage (VSS) electrode.

In the second pixel P2, the first electrode 21 may be disposed on a bank layer 26. The first electrode 21 of the second pixel P2 may be disposed to surround and cover an upper surface of the bank layer 26 and both side walls thereof. The first electrode 21 may be the anode electrode for a data line. In this regard, the first electrode 21 of the second pixel P2 may be disposed to surround the upper surface and both opposing walls of the bank layer 26 so as to receive a larger amount of VDD power or VSS power than an amount of the light emission power which the first electrode 11 of the first pixel P1 receives.

A diffuser window layer 25 may be disposed on the first electrode 21.

A conductive layer 23 may be disposed on the first electrode 21, and an active layer 20 may be disposed on the conductive layer 23. The active layer 20 may be referred to as a ‘light-emission layer’ or ‘a light-emissive element’.

A sidewall diffuser layer 24 may be disposed on the diffuser window layer 25 so as to surround the conductive layer 23 and the active layer 20.

The power supply electrode 22 may be disposed on the sidewall diffuser layer 24 and the active layer 20. The power supply electrode 22 may be the high-potential voltage (VDD) electrode or the low-potential voltage (VSS) electrode.

The display device 1 of FIG. 1 according to an embodiment of the present disclosure may include a driver for controlling a light-emission operation of at least one or more first pixels P1. The driver may be disposed on a rear surface of the display panel in the first area as the display area AA. When the driver receives image data and a light-emission control command from a timing controller, the driver may apply a data voltage corresponding to the image data to each of the first pixels P1. For example, the driver may generate a coordinate value of each sub-pixel to emit light among the first sub-pixel to third sub-pixel upon receiving an image signal. The driver may apply the data voltage set during a first control period to each sub-pixel to emit light corresponding to the generated coordinate value for a pulse width set during a second control period.

Figure 3:
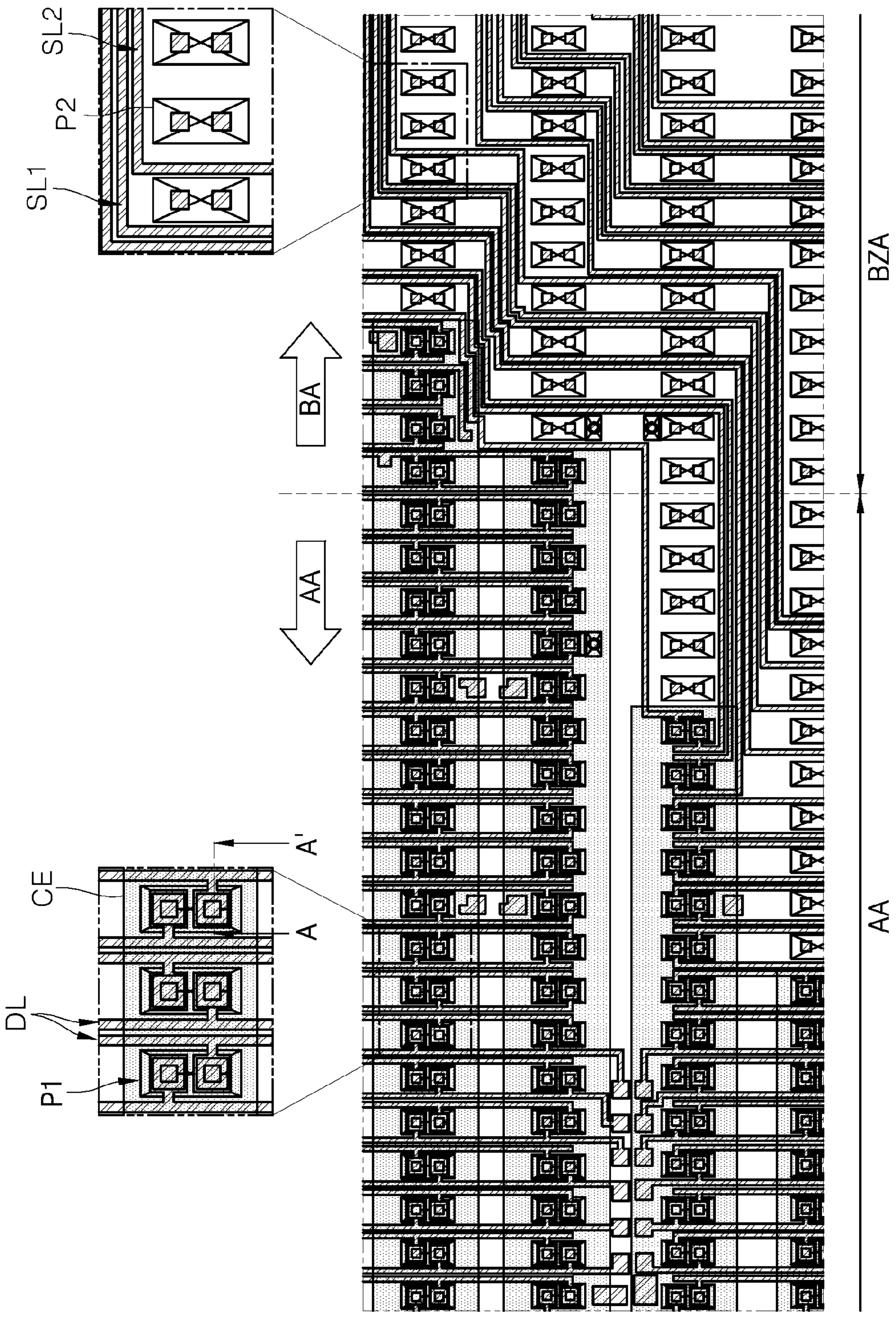
FIG. 3 is a diagram showing a connection structure of each of a first pixel and a second pixel before a display panel according to an embodiment of the present disclosure is applied to a display device.

FIG. 3 is a diagram showing a connection structure of each of the first pixel and the second pixel before a display panel according to an embodiment of the present disclosure is applied to the display device.

Referring to FIG. 3, the first pixel P1 before the display panel according to an embodiment of the present disclosure is applied to the display device may be disposed in the first area AA and include one or more light emitting elements LE, wherein a signal line, for example, a data line DL is connected to one side of one light emitting element LE, while the data line DL as the signal line is connected to one side of another emitting element LE. Additionally, a cathode electrode CE is disposed to cover all of the first pixels P1. A cross-sectional structure along A-A' in FIG. 3 may be formed in the same manner as that shown in FIG. 2A as described above.

To the contrary, the second pixel P2 disposed in the second area BZA as the bezel area only has the light emitting element LE located at each position and does not have a signal line connected to one side thereof, and does not have a signal line connected to the other side thereof. Additionally, the cathode electrode which may cover all of the plurality of second pixels P2 is not disposed therein.

Figure 4:
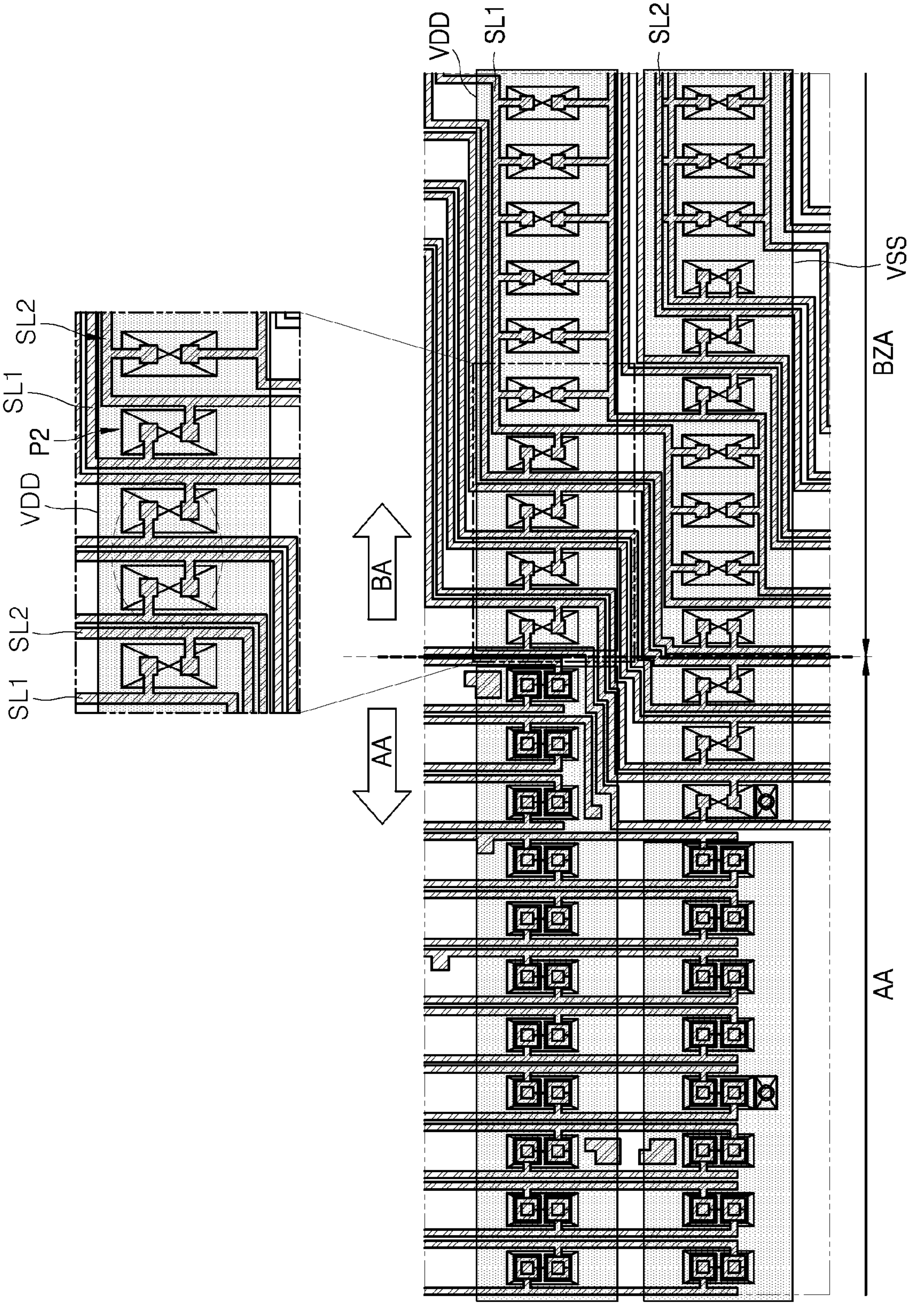
FIG. 4 is a diagram showing a connection structure of a second pixel after a display panel according to an embodiment of the present disclosure is applied to a display device.

FIG. 4 is a diagram showing a connection structure of the second pixel after a display panel according to an embodiment of the present disclosure is applied to the display device.

Referring to FIG. 4, the second pixel P2 after the display panel according to an embodiment of the present disclosure is applied is disposed in the second area BZA as the bezel area, and has a first signal line SL1 connected to one side thereof and a second signal line SL2 connected to the other side thereof. In this regard, a first power wiring plate VDD in a plate shape is disposed in an upper area of the second area BZA so as to cover the plurality of second pixels P2. The first power wiring plate VDD acts as a wiring for receiving a high potential voltage, and is in contact with each of the light emitting elements LE of the second pixel P2. Further, in a lower area of the second area BZA, a second power wiring plate VSS in a plate shape is disposed to cover the plurality of second pixels P2. The second power wiring plate VSS acts as a wiring for receiving a low-potential voltage, and is in contact with each of the light emitting elements LE of the second pixel P2.

Accordingly, when static electricity is generated in the display panel 5, and thus even when shock power due to the static electricity is applied to the display panel 5, the shock power may flow from first signal line SL1 or the second signal line SL2 to the first power wiring plate VDD or the second power wiring plate VSS due to the second pixel P2 disposed in the second area BZA. Accordingly, damage to the display panel 5 due to the static electricity may be prevented.

Figure 5A:
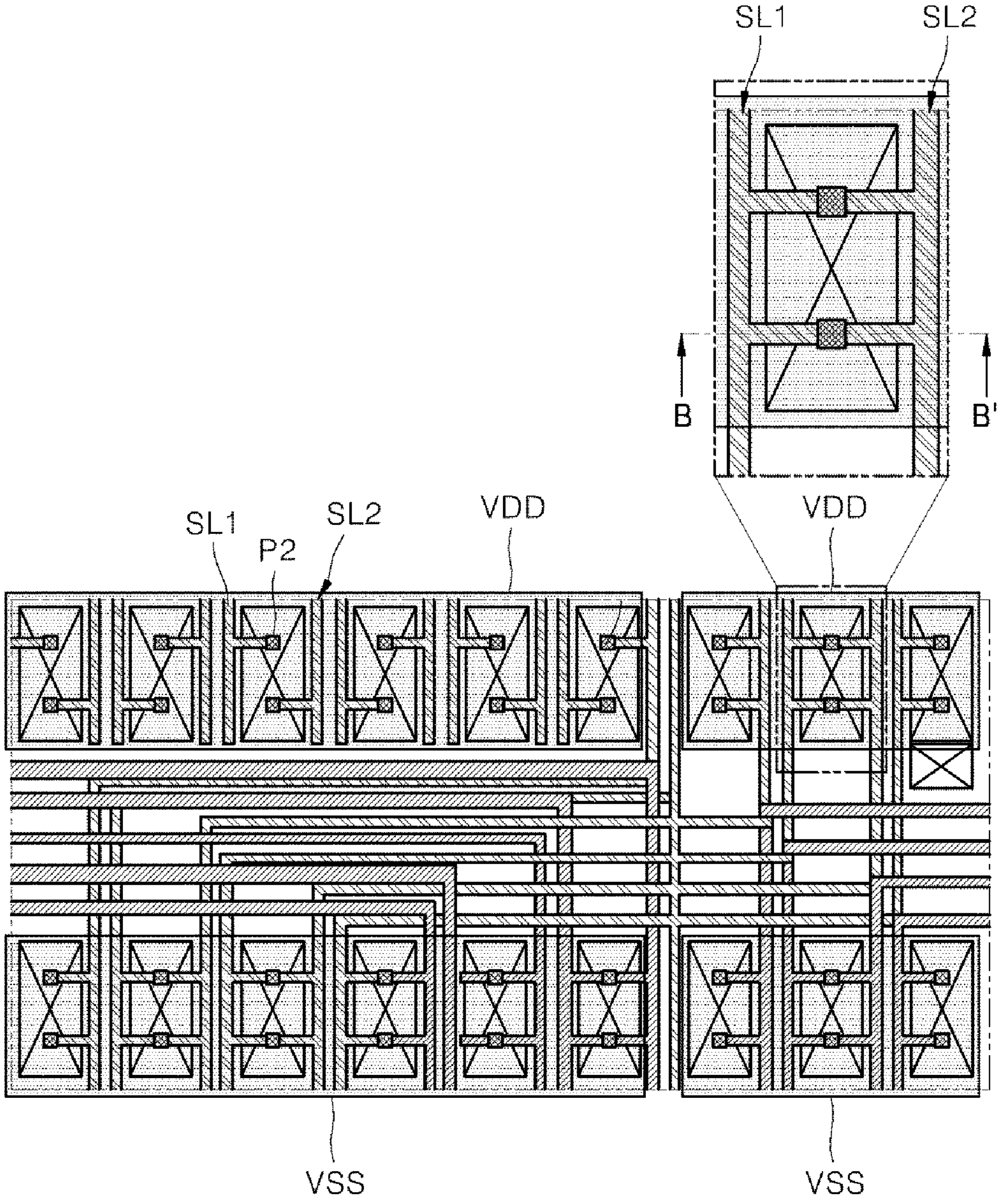
FIG. 5A is a diagram showing a connection structure of one or more second pixels disposed in a second area of a display panel according to an embodiment of the present disclosure.
Figure 5B:
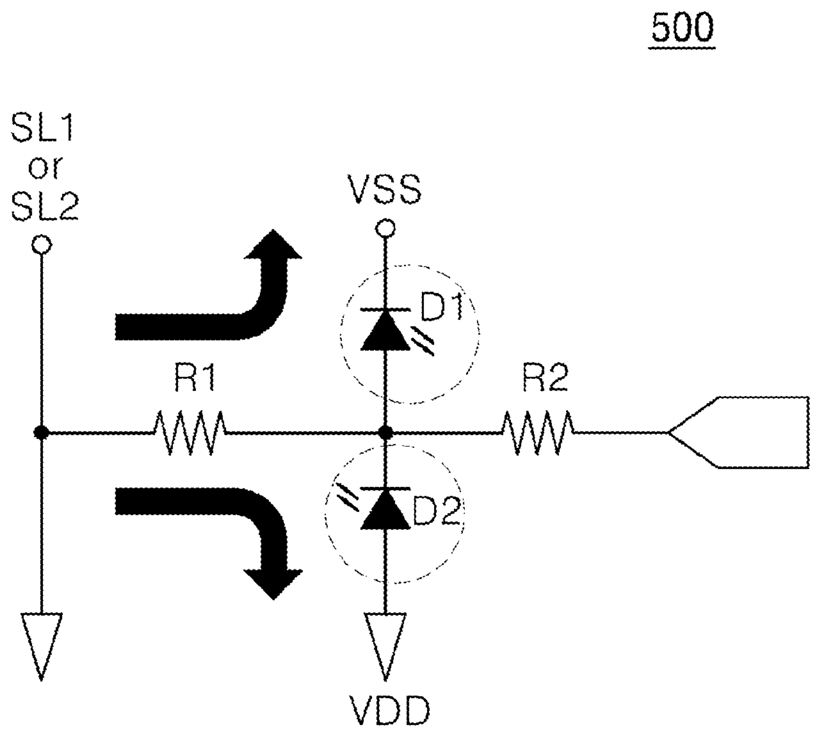
FIG. 5B is a diagram showing an example of an ESD circuit implemented by the connection structure of one or more second pixels in FIG. 5A.

FIG. 5A is a diagram showing a connection structure of at least one second pixel disposed in the second area of the display panel according to an embodiment of the present disclosure. FIG. 5B is a diagram showing an example of an ESD circuit implemented based on the connection structure of at least one second pixel in FIG. 5A.

Referring to FIG. 5A and FIG. 5B, one or more second pixels P2 disposed in the second area of the display panel according to an embodiment of the present disclosure may have one side connected to the first signal line SL1 or the second signal line SL2, and an upper side as the other side connected to the first power wiring plate VDD or the second power wiring plate VSS. Thus, the ESD prevention circuit may be implemented. In this way, the ESD prevention circuit is not composed of a TFT circuit, but may be implemented using the light emitting element LE or the pixel with diode characteristics. Thus, this may also be applied when the P1 element of the display panel 5 is driven by a separate driving chip without a semiconductor layer and transistor.

The ESD circuit based on the connection structure of the second pixel P2 has the signal line SL1 or SL2 disposed at one side thereof. Thus, two second pixels P2 may operate as a first diode D1 and a second diode D2, respectively. The high power voltage (VDD) line is connected to the second diode D2, and the low-potential voltage (VSS) line is connected to the first diode D1. In this regard, the first signal line SL1 and the second signal line SL2 may be connected to some of the second pixels P2 and may surround the upper surface and both opposing walls of the bank layer 26. This may be the same as the description of FIG. 2B as set forth above, which illustrates the cross section of B-B'.

Therefore, when static electricity is generated, the impact power by the static electricity is applied to the signal line SL1 or SL2 and, thus, the current resulting from the impact power flows through the first diode D1 or the second diode D2 to the high power voltage (VDD) line or the low-potential voltage (VSS) line.

Figure 6:
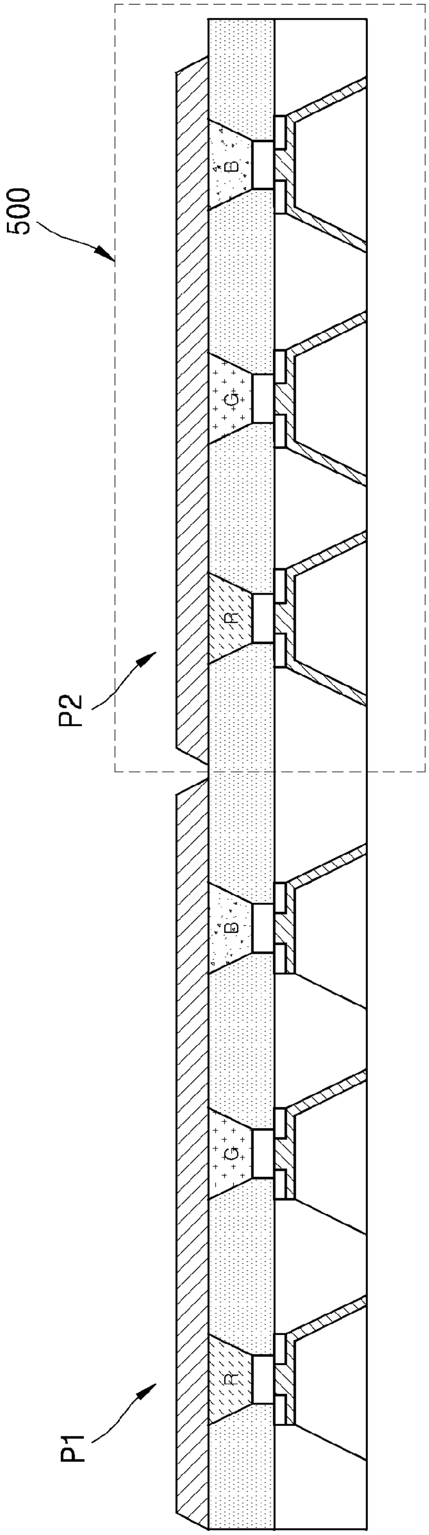
FIG. 6 is a cross-sectional view showing a connection structure of each of a first pixel and a second pixel according to an embodiment of the present disclosure.
Figure 7:
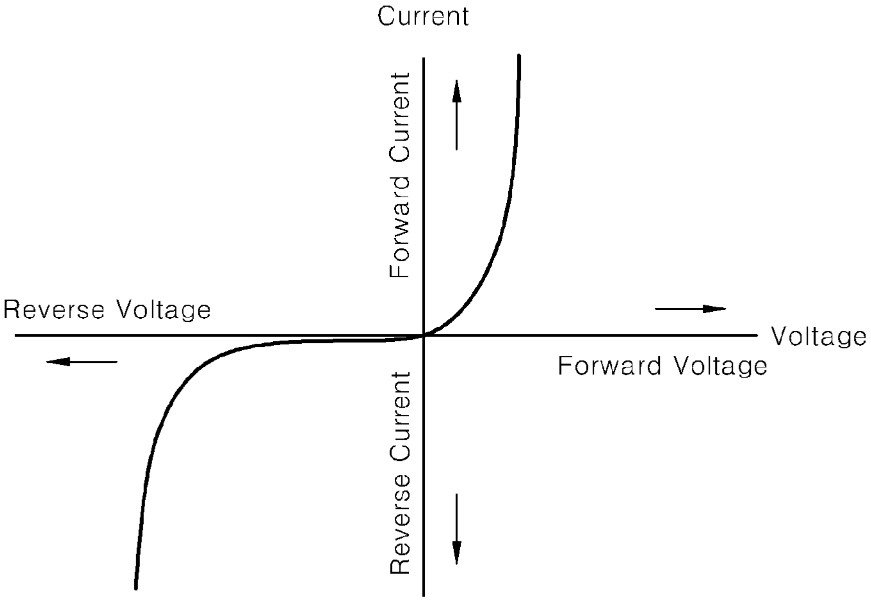
FIG. 7 is a graph showing characteristics of a diode of a second pixel according to an embodiment of the present disclosure.

FIG. 6 is a cross-sectional view showing a connection structure of each of the first pixel and the second pixel according to an embodiment of the present disclosure. FIG. 7 is a diagram showing an ESD circuit implemented based on the connection structure of the second pixel according to an embodiment of the present disclosure.

Referring to FIG. 6, the first pixel P1 according to an embodiment of the present disclosure may include elements that emit red (R), green (G), and blue (B) color light, respectively.

The first pixel P1 may include red (R), green (G), and blue (B) light-emitting elements LE, and each element may have the same structure as the stack structure as described in FIG. 2A above.

Unlike the second pixel P2, each element of the first pixel P1 has the first electrode disposed on the bank layer so as to cover the upper surface of the bank layer and one side wall of the bank layer.

The second pixel P2 is disposed in the second area BZA as the bezel area and may include red (R), green (G), and blue (B) light-emitting elements LE, and each element may have the same structure as the stack structure as described above in FIG. 2A or FIG. 2B.

Unlike the first pixel P1, a portion of the second pixel P2 has the first electrode disposed on the bank layer so as to cover the upper surface of the bank layer and both side walls of the bank layer.

Further, although not shown, the first electrode of the element of the second pixel P2 is connected to the ground, and the second electrode as the power supply electrode of the element of the second pixel P2 is connected to the power supply line.

In this regard, the first electrode of the element of the second pixel P2 may act as the data line electrode, while the power supply electrode as the second electrode thereof may act as the high-potential voltage (VDD) electrode or the low-potential voltage (VSS) electrode.

Therefore, the connection structure 500 composed of red (R), green (G), and blue (B) light-emitting elements LE of the second pixel P2 may function as the ESD circuit as shown in FIG. 5B.

In this regard, the signal line is connected to one side of the ESD circuit. The first diode D1 is connected to this signal line via a resistor R1, and is connected to the high-potential voltage (VDD) line at an upper position. The second diode D2 is connected to the transistor T1 via the resistor R1, and is connected to the low-potential voltage (VSS) line at a lower position. Accordingly, the light-emitting element LE of the second pixel P2 does not function as a light-emitting element LE that outputs light, but may perform a function of the first diode D1 or the second diode D2 having the characteristics as shown in FIG. 7. FIG. 7 is a graph showing the characteristics of the diode of the second pixel according to an embodiment of the present disclosure. As shown in FIG. 7, when the second pixel P2 performs the function of the first diode D1 or the second diode D2, current flows therethrough only in one direction when a specific voltage is applied thereto.

Therefore, when the static electricity is generated, the current resulting from the impact power generated by the static electricity flows from the transistor TR to the high-potential voltage (VDD) line via the first diode D1 or flows from the transistor TR to the low-potential voltage (VSS) line via the second diode D2.

The light-emitting element LE according to an embodiment of the present disclosure may be embodied as a blue light-emitting element LE that emits light of a blue wavelength. Quantum dot particles may be dispersed in a color filter layer used as a color conversion layer to convert the blue light to different colors (e.g., red or green, where necessary).

Due to use of a single wavelength light-emitting element LE, there is no need for a process of transferring light-emitting elements LE emitting light of different wavelengths, respectively. Rather, the light-emitting elements emitting light of the same wavelength may be used. In this regard, a color filter layer for color conversion may be used, wherein the quantum dot particles may be added to the color filter layer to maintain light efficiency. Thus, the display device 1 may be manufactured in a simplified process.

Due to the simplified transfer process, defects that may occur in the sub-pixel may be minimized. A unit pixel is composed of a plurality of sub-pixels. Thus, the color filter layer may be implemented using any one sub-pixel constituting the unit pixel. Thus, when a defect occurs in one sub-pixel among the plurality of sub-pixels, the defective sub-pixel may be repaired.

In one example, a light-emitting element LE according to an embodiment of the present disclosure may include a light-emissive layer, a first electrode, a second electrode, and an insulating film. The light-emissive layer may include a first semiconductor layer, an active layer, and a second semiconductor layer. The light-emitting element LE emits light based on recombination of electrons and holes according to the current flowing between the first electrode and the second electrode.

The first semiconductor layer may be a p-type semiconductor layer, and the second semiconductor layer may be an n-type semiconductor layer. Alternatively, the first semiconductor layer may be a n-type semiconductor layer, and the second semiconductor layer may be a p-type semiconductor layer. However, for convenience of description, an example in which the first semiconductor layer is a p-type semiconductor layer, and the second semiconductor layer is an n-type semiconductor layer will be described. In addition, the first electrode and the second electrode may be referred to as a p-type electrode and an n-type electrode based on an electrical connection relationship between the first electrode and the second electrode and the first semiconductor layer and the second semiconductor layer. Alternatively, the first electrode and the second electrode may be referred to as a n-type electrode and a p-type electrode. However, for convenience of description, an example in which the first electrode and the second electrode are a p-type electrode and an n-type electrode, respectively will be described.

The first semiconductor layer is provided on the active layer and provides holes to the active layer. The first semiconductor layer according to an embodiment of the present disclosure may be made of a p-GaN-based semiconductor material, and the p-GaN-based semiconductor material may include GaN, AlGaN, InGaN, or AlInGaN. In this regard, Mg, Zn, or Be may be used as an impurity used for doping of the second semiconductor layer.

The second semiconductor layer provides electrons to the active layer. The second semiconductor layer according to an embodiment of the present disclosure may be made of an n-GaN-based semiconductor material, and the n-GaN-based semiconductor material may include GaN, AlGaN, InGaN, or AlInGaN. In this regard, Si, Ge, Se, Te, or C may be used as an impurity used for doping of the second semiconductor layer.

The active layer is provided on the second semiconductor layer. The active layer may include a multi-quantum well (MQW) structure having a well layer and a barrier layer having a higher band gap than that of the well layer. The active layer according to an embodiment of the present disclosure may have a multi-quantum well structure such as InGaN/GaN.

The first electrode is electrically connected to the first semiconductor layer and is connected to a drain electrode or a source electrode of a driving thin-film transistor, and the second electrode is connected to a common power line.

The aforementioned first electrode may be a p-type electrode and the second electrode may be an n-type electrode. Whether the first electrode is a p-type electrode and the second electrode is an n-type electrode or the first electrode is a n-type electrode and the second electrode is an p-type electrode may be determined according to whether the corresponding electrode supplies electrons or holes, that is, whether the corresponding electrode is electrically connected to the p-type semiconductor layer or is connected to the n-type semiconductor layer. However, in the present disclosure, for convenience of description, an example in which the first electrode and the second electrode are a p-type electrode and an n-type electrode, respectively will be described.

Each of the first and second electrodes according to an embodiment of the present disclosure may include one or more of metal materials such as Au, W, Pt, Si, Ir, Ag, Cu, Ni, Ti, or Cr and alloys thereof. Each of the first electrode and the second electrode according to another embodiment may be made of a transparent conductive material, and the transparent conductive material may include ITO (Indium Tin Oxide) or IZO (Indium Zinc Oxide). However, the present disclosure is not limited thereto.

The insulating film is disposed to cover an outer surface of the light-emitting element and has an insulating film open area (P-Open) defined therein to expose at least a portion of each of the first electrode and the second electrode. The insulating film may be made of a material such as SiNx or SiOx and is disposed to cover the active layer.

The insulating film prevents unintended electrical connection between elements when the first electrode and the second electrode in the light-emitting element and the pixel electrode PE or the common electrode are electrically connected to each other.

Additionally, the second semiconductor layer, the active layer, and the first semiconductor layer may be sequentially stacked on a semiconductor substrate to constitute a light-emitting element. In this regard, the semiconductor substrate includes a sapphire substrate, sapphire substrate or a silicon substrate. This semiconductor substrate may be used as a growth substrate for growing each of the second semiconductor layer, the active layer, and the first semiconductor layer, and then may be removed from the second semiconductor layer in a substrate separation process. In this regard, the substrate separation process may include a laser lift off process or a chemical lift off process. Accordingly, as the semiconductor substrate for growth is removed from the light-emitting element, the light-emitting element may have a relatively thin thickness, and thus may be accommodated in each sub-pixel.

In one example, as a voltage is applied to the p-type electrode and the n-type electrode in the light-emitting element, electrons and holes are injected from the n-type GaN layer and the p-type GaN layer to the active layer, respectively. Thus, excitons are generated in the active layer. As these excitons decay, light corresponding to an energy difference between the LUMO (Lowest Unoccupied Molecular Orbital) level and the HOMO (Highest Occupied Molecular Orbital) level of the light-emissive layer is generated and emitted to the outside.

In this regard, a wavelength of the light emitted from the light-emitting element may be controlled by adjusting a thickness of the barrier layer of the multi-quantum well structure of the active layer.

The light-emitting element may be formed to have a size of about 10 to 100 μm. The light-emitting element may be fabricated by forming a buffer layer on a substrate 110 and growing a GaN thin-film on the buffer layer. In this regard, sapphire, silicon (Si), GaN, silicon carbide (SiC), gallium arsenide (GaAs), zinc oxide (ZnO), etc. may be used as a material of the substrate for the growth of the GaN thin-film.

Further, when the substrate for growing the GaN thin-film is not made of GaN but a material other than GaN, lattice mismatch may occur when the n-type GaN layer 145 as an epitaxial layer is directly grown on the substrate. In this regard, the buffer layer is provided to prevent quality deterioration due to the lattice mismatch and is made of AlN or GaN.

The n-type GaN layer may be formed by growing a GaN layer not doped with impurities and then doping an n-type impurity such as silicon (Si) into a top portion of the undoped GaN layer. Further, a p-type GaN layer may be formed by growing an undoped GaN thin-film and then doping p-type impurities such as Mg, Zn, and Be into the undoped GaN thin-film.

The light-emitting element having a specific structure may be disposed on top of the protection layer. However, the present disclosure is not limited to the light-emitting element of the specific structure. Light-emitting elements of various structures, such as a vertical type light-emitting element and a horizontal type light-emitting element may be applied to the display device.

In one example, each of the first sub-pixel R to the fourth sub-pixel W may be disposed in a flip scheme. In this regard, the flip scheme may refer to a scheme in which when the light-emitting element is, for example, a micro-LED chip, first and second electrodes of the chip are turned upside down.

Each of the first sub-pixel R to the fourth sub-pixel W may be disposed in a vertical scheme. In this regard, the vertical scheme refers to a scheme in which when the light-emitting element is, for example, a micro-LED chip, the first and second electrodes of the chip are not arranged in the horizontal direction but are arranged in the vertical direction.

A spare area corresponding to each sub-pixel may be disposed around each sub-pixel of the first sub-pixel R to the fourth sub-pixel W.

A fifth sub-pixel emitting light of the same color as a color of light emitted from one of the first sub-pixel R to the fourth sub-pixel W may be disposed in each spare area.

Each fifth sub-pixel may emit light of the same color as a color of light emitted from the sub-pixel corresponding to each spare area.

In one example, the driver may generate a coordinate value of each sub-pixel to emit light among the first sub-pixel R to the fourth sub-pixel W upon receiving an image signal. The driver may apply the data voltage set during a first control period to each sub-pixel to emit light corresponding to the generated coordinate value for a pulse width set during a second control period.

As described above, according to an embodiment of the present disclosure, the display panel in which the light-emitting element disposed in the bezel area BA but not used as the pixel may be used as the element that copes with the static electricity may be realized.

Moreover, according to an embodiment of the present disclosure, the display panel may be realized in which a static electricity coping electrode is disposed at each of the light-emitting elements disposed in the bezel area of the display panel such that each of the light-emitting elements at which the static electricity coping electrode is disposed acts as a static electricity coping area. Further, the display device that includes the display panel may be provided.

In another implementation, a display panel comprises a plurality of bezel area pixels disposed in a bezel area of the display panel surrounding at least a part of the active area, one or more of the bezel area pixels each including one or more bezel area sub-pixels configured not to emit light, a plurality of bezel area pixels disposed in a bezel area of the display panel surrounding at least a part of the active area, one or more of the bezel area pixels each including one or more bezel area sub-pixels configured not to emit light, wherein the bezel area sub-pixels comprise: a first bezel area sub-pixel having a first electrode and a second electrode, the first electrode electrically connected to a common node and the second electrode electrically connected to a first power supply line: and a second bezel area sub-pixel having a third electrode and a fourth electrode, the third electrode electrically connected to the common node and the fourth electrode electrically connected to a second power supply line different from the first power supply line.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects. The scope of protection of the present disclosure should be interpreted according to the scope of claims, and all technical ideas within an equivalent scope thereto should be interpreted as being included in the scope of rights of the present disclosure.

What is claimed is:

1. A display panel comprising:

a plurality of active area pixels disposed in an active area of the display panel, each of the active area pixels including one or more active area sub-pixels configured to emit light to display an image on the display panel, each active area pixel directly coupled to a corresponding data line;

a plurality of bezel area pixels disposed in a bezel area of the display panel surrounding at least a part of the active area, one or more of the bezel area pixels each including one or more bezel area sub-pixels configured not to emit light ;and a plurality of signal lines extending from the active area to the bezel area, two or more bezel area pixels directly coupled to a corresponding one of the plurality of signal lines, the plurality of signal lines forming paths for static electricity in the display panel to discharge;

wherein the bezel area sub-pixels comprise:

a first bezel area sub-pixel having a first electrode and a second electrode, the first electrode electrically connected to a common node and the second electrode electrically connected to a first power supply line; and a second bezel area sub-pixel having a third electrode and a fourth electrode, the third electrode electrically connected to the common node and the fourth electrode electrically connected to a second power supply line different from the first power supply line.

2. The display panel of claim 1, wherein electrostatic is discharged from the common node to the first power supply line via the first bezel area sub-pixel or to the second power supply line via the second bezel area sub-pixel.

3. The display panel of claim 1, wherein the common node is electrically connected to a common voltage connected to electrodes of the active area sub-pixels.

4. The display panel of claim 1, wherein the common node is electrically connected to a data line driving data voltages to electrodes of the active area sub-pixels.

5. The display panel of claim 1, wherein each of the active area sub-pixels includes an organic light-emitting diode or a micro-LED.

6. The display panel of claim 1, wherein at least one of the active area sub-pixels comprises:

an anode disposed on a bank layer so as to cover an upper surface and one side wall of the bank layer, a diffuser window layer disposed on the anode and the bank layer, a conductive layer disposed on the anode, an active layer disposed on the conductive layer, a sidewall diffuser layer disposed on the diffuser window layer so as to surround the conductive layer and the active layer, and a cathode disposed on the sidewall diffuser layer and the active layer.

7. The display panel of claim 1, wherein at least one of the bezel area sub-pixels comprises:

an anode disposed on a bank layer so as to cover an upper surface and both side wall surfaces of the bank layer, a diffuser window layer disposed on the anode, a conductive layer disposed on the anode, an active layer disposed on the conductive layer, a sidewall diffuser layer disposed on the diffuser window layer so as to surround the conductive layer and the active layer, and a cathode disposed on the sidewall diffuser layer and the active layer.

8. A display device comprising:

the display panel according to claim 1; and a driver disposed on a rear surface of the display panel in the active area, wherein the driver controls an amount of light emitted from the active area sub-pixels.

9. A display device comprising:

a display panel including:

at least one first pixel disposed in a first area, each of the at least one first pixel directly coupled to a corresponding data line;

a plurality of second pixels disposed in a second area; and a plurality of signal lines extending from the first area to the second area, two or more second pixels directly coupled to a corresponding one of the plurality of signal lines, the plurality of signal lines forming paths for static electricity in the display panel to discharge; and a driver disposed on a rear surface of the display panel in the first area, wherein the driver controls a light-emission operation of the at least one first pixel, wherein the first pixel includes at least one sub-pixel, wherein each of the at least one sub-pixel thereof has a first electrode at one side and a second electrode at the other side thereto, wherein the second pixel includes at least one sub-pixel, wherein each of the at least one sub-pixel thereof has a first electrode at one side and a power supply electrode at the other side thereto, wherein the first electrode of the sub-pixel of the second pixel is connected to a ground, and the power supply electrode is connected to a power supply line, wherein the first pixel and the second pixel operate at voltages of different potentials, respectively.

10. The display device of claim 9, wherein the at least one sub-pixel of the first pixel is configured to emit light of one color of red, green, blue, and white.

11. The display device of claim 9, wherein the voltages of the different potentials include a data voltage applied to the first pixel, and a voltage of an impact power generated due to static electricity applied to the second pixel.

12. The display device of claim 9, wherein the driver is configured to apply a data voltage set during a first control period to each of the at least one sub-pixel of the first pixel to cause each sub-pixel to emit light corresponding to a generated coordinate value for a pulse width set during a second control period.

13. The display device of claim 9, wherein the first area is a display area and the second area is a bezel area.

14. The display device of claim 9, wherein a spare area is disposed around each of the first pixel and the second pixel.

* * * * *